(12) United States Patent
Jolliffe et al.

(10) Patent No.: US 6,182,571 B1
(45) Date of Patent: *Feb. 6, 2001

(54) PLANOGRAPHIC PRINTING

(75) Inventors: Barry Jolliffe, Widnes; Harjit Singh Bhambra, Leeds; Robert M. Organ, Wantage, all of (GB)

(73) Assignee: Kodak Polcyhrome Graphics LLC, Norwalk, CT (US)

( * ) Notice: Under 35 U.S.C. 154(b), the term of this patent shall be extended for 0 days.

This patent is subject to a terminal disclaimer.

(21) Appl. No.: 09/308,702

(22) PCT Filed: Nov. 13, 1997

(86) PCT No.: PCT/GB97/03128

§ 371 Date: Jun. 29, 1999

§ 102(e) Date: Jun. 29, 1999

(87) PCT Pub. No.: WO98/22853

PCT Pub. Date: May 28, 1998

(30) Foreign Application Priority Data

Nov. 21, 1996 (GB) .................................................. 9624224

(51) Int. Cl.$^7$ ................................. G03F 7/105; B41N 3/03
(52) U.S. Cl. ........................... 101/465; 101/455; 101/456
(58) Field of Search ..................................... 101/454, 455, 101/456, 457, 458, 459, 465, 466; 430/302

(56) References Cited

U.S. PATENT DOCUMENTS

| | | | |
|---|---|---|---|
| 2,714,066 | 7/1955 | Jewett et al. ........................ | 430/302 |
| 2,922,715 | * 1/1960 | Gumbinner ........................... | 101/455 |
| 3,181,461 | 5/1965 | Fromson .............................. | 101/456 |
| 3,470,013 | 9/1969 | Wagner ................................ | 101/453 |
| 3,640,221 | 2/1972 | Wyke .................................... | 101/453 |
| 3,963,594 | 6/1976 | Brasko ................................. | 205/658 |
| 3,971,660 | 7/1976 | Staehle ................................. | 430/18 |
| 4,052,275 | 10/1977 | Gumbinner et al. ................. | 205/684 |
| 4,072,589 | 2/1978 | Golda et al. .......................... | 205/658 |
| 4,131,518 | 12/1978 | Fromson .............................. | 205/324 |
| 4,232,105 | * 11/1980 | Shinohara et al. .................. | 101/456 |
| 4,268,609 | 5/1981 | Shiba et al. ....................... | 430/271.1 |
| 4,330,605 | 5/1982 | Boston ................................. | 430/14 |
| 4,420,549 | 12/1983 | Cadwell .............................. | 430/158 |
| 4,457,971 | 7/1984 | Caldwell et al. .................... | 428/323 |
| 4,542,089 | 9/1985 | Caldwell et al. .................... | 430/276 |
| 4,567,131 | 1/1986 | Watkiss ............................... | 430/309 |
| 5,171,650 | 12/1992 | Ellis et al. ............................ | 430/20 |
| 5,881,645 | 3/1999 | Lenney et al. ..................... | 101/463.1 |

FOREIGN PATENT DOCUMENTS

| | | |
|---|---|---|
| 112615 | 12/1898 | (DE) . |
| 11 18 009 | 3/1957 | (DE) . |
| 31 44 657 A1 | 11/1981 | (DE) . |
| 0 028 137 A1 | 5/1981 | (EP) . |
| 0 110 417 A2 | 6/1984 | (EP) . |
| 565 006 A2 | 10/1993 | (EP) . |
| 0 619 524 A1 | 10/1994 | (EP) . |
| 0 619 525 A1 | 10/1994 | (EP) . |
| 0 620 502 A1 | 10/1994 | (EP) . |
| 0 653 685 A1 | 5/1995 | (EP) . |
| 956376 | 4/1964 | (GB) . |
| 1141556 | 1/1969 | (GB) . |
| 1196886 | 7/1970 | (GB) . |
| 1439127 | 6/1976 | (GB) . |
| 2031442 | 4/1980 | (GB) . |
| 1592281 | 7/1981 | (GB) . |
| 2069164 | 8/1981 | (GB) . |
| 2080964 | 2/1982 | (GB) . |
| 2109573 | 6/1983 | (GB) . |
| 2222553 | 3/1990 | (GB) . |
| 84994 | 7/1981 | (JP) ...................................... 101/455 |
| 59-214651 | 12/1984 | (JP) . |
| 61-123594 | 6/1986 | (JP) . |
| 63-268642 | 11/1988 | (JP) . |
| WO 89/01871 | 3/1989 | (WO) . |
| WO 91/12140 | 8/1991 | (WO) . |
| WO 94/05507 | 3/1994 | (WO) . |
| WO 97/19819 | 6/1997 | (WO) . |
| WO 98/22853 | 5/1998 | (WO) . |

\* cited by examiner

Primary Examiner—Stephen R. Funk
(74) Attorney, Agent, or Firm—Ratner & Prestia

(57) ABSTRACT

A method for forming a planographic printing member is disclosed. A hydrophilic layer is formed on a support by contacting the support with a silicate solution that contains a silicate and a particulate material. An image layer is provided over the hydrophilic layer. The hydrophilic layer is treated to ensure that the image layer is able to change color on exposure. The hydrophilic layer may be treated with an acid, with a buffer formulation, with a colloidal suspension, or with a salt. Preferably the hydrophilic layer is treated with aluminum sulphate.

30 Claims, No Drawings

PLANOGRAPHIC PRINTING

This application is a U.S. National Phase Application of PCT International Application PCT/GB97/03128, international filing date Nov. 13, 1997.

FIELD OF THE INVENTION

This invention relates to planographic printing and provides a method of preparing a planographic printing member, for example a plate, and a planographic printing member per se. The invention particularly, although not exclusively, relates to lithographic printing.

BACKGROUND OF THE INVENTION

Lithographic processes involve establishing image (printing) and non-image (non-printing) areas on a substrate, substantially on a common plane. When such processes are used in printing industries, non-image areas are generally hydrophilic and image areas are generally oleophillic. Consequently, oil based inks are repelled from the non-image areas after water has been applied to the substrate.

Image and non-image areas can be created by processes which include a step of exposing a layer of image material on the surface of the substrate to radiation. The exposure to radiation creates solubility differences in the image material corresponding to image and non-image areas. During development, the more soluble areas are removed, leaving a pattern on the substrate corresponding to the image.

Preparation of the substrate for receiving a layer of the image material must ensure that the image material bonds to the substrate. However, it must allow release of the soluble image material during development.

In addition, other problems need to be addressed when preparing a printing plate. For example, it is desirable for the image material to change color when it is exposed. This is generally achieved by including a pH sensitive dye in the material of the image layer, the dye often being arranged to change color by reaction with acid produced during a photochemical reaction of the light sensitive material of the image layer. However, it has been found that properties of the substrate itself can affect the ability of the dye to change color. In addition, it is desirable for the dye not to stain the substrate to any significant degree since, otherwise, on development, such staining will be visible. This would be aesthetically unacceptable and, furthermore, would be commercially unacceptable since plate processing personnel would be unable to determine whether a plate had been fully developed.

It is also desirable for it to be possible to remove unwanted image areas from a printing plate after exposure, for example to correct an error, in order to prevent such areas inking in and, therefore, being printed. The ability to remove selected areas will depend, to some extent, on the adhesive force between the substrate and the material of the image layer.

It is an object of the present invention to address the above-described problems.

DESCRIPTION OF THE INVENTION

According to a first aspect of the present invention, there is provided a method of preparing a planographic printing member comprising:
a) forming a hydrophilic layer on a support by contacting the support with a fluid containing a particulate material;
b) applying a modifying means over said hydrophilic layer for modifying interaction between said hydrophilic layer and a material subsequently applied; and
c) providing an image layer over said hydrophilic layer, wherein an indicator means is associated with said image layer for indicating whether said image layer is in a first or a second state.

Preferably, said planographic printing member is a printing plate.

Preferably, said indicator means is adapted for visually indicating whether said image layer is in a first or second state. Preferably, said indicator means is arranged to undergo a chemical reaction, for example an acid-base or oxidation/reduction reaction, when said image layer changes from said first state to said second state.

Preferably, said indicator means is adapted to indicate whether the image layer has been exposed. Preferably, said indicator means causes the printing member to display a different color after exposure compared to the color displayed before exposure.

Said indicator means may comprise a photo-oxidative system, suitably using a free radical generator, for example triazine, arranged to oxidize an indicator material, for example a leucobase dye. Alternatively, said indicator means may comprise a photo-acid generator.

Preferably, the image layer is adapted to have a different, for example a lower, pH after exposure compared to the pH before exposure. For example, the image layer may be adapted to produce $H^+$ (or other acidic species) upon exposure.

Said indicator means is preferably pH sensitive. Said indicator means is preferably a pH indicator.

Said indicator means is preferably incorporated in said image layer, for example by being dispersed therein.

A suitable modifying means can be selected by comparing the effect of a proposed modifying means on said indicator means when said proposed modifying means has been applied, with the effect (if any) when said proposed modifying means has not been applied. When no modifying means is applied, the indicator means may be incapable of indicating between said first and second states of said image layer.

Said modifying means is preferably applied at ambient temperature or above, more preferably in the range 20° C. to 90° C., especially 20° C. to 60° C.

Preferably, said modifying means is arranged to lower the pH of at least the outermost surface of the hydrophilic layer, so that its pH after application of said modifying means is less than its pH before application. Preferably, the pH (before application) of the fluid used in step (a) is greater than the pH (before application) of the modifying means used in step (b). The pH of the fluid may be greater than 9.0, preferably greater than 9.5 and, more preferably, greater than 10.0. The pH of the modifying means may be less than 10.0, preferably less than 9.0, more preferably less than 8.0. Especially preferred is the case wherein the pH is about 7 or below. In the most preferred embodiments, the pH is less than 5.0. The pH may be above 1, preferably above 2 and more preferably above 3.

Some modifying means suitable for use in said method, for example sulphuric acid, affect whether a deletion means, for example a deletion fluid, in particular a deletion gel or pen, can be used to satisfactorily remove ink receptive areas of said image layer. Preferably, said modifying means is arranged such that a selected deletion means can be used to make areas of said printing member to which it is applied less ink receptive (and preferably substantially non-ink receptive) compared to when said modifying means consists essentially of 0.1M sulphuric acid.

Said deletion means preferably includes a solvent, suitably an organic solvent, with N-methylpyrolidone and cyclohexanone being especially preferred; an etchant material which may be acidic or alkaline but is preferably acidic, and is suitably selected from phosphoric acid, hydrogen fluoride and ammonium bifluoride; and other minor components, for example surface active agents, thickeners and the like.

Preferably, said modifying means includes water as a solvent. Preferably, said modifying means comprises an aqueous solution or dispersion. Preferably, said modifying means includes one or more components selected from acids, buffer formulations, colloidal suspensions and salts.

Preferred acids are protic acids and include phosphoric acid, sulphuric acid, hydrochloric acid, nitric acid, acetic acid, citric acid, sodium hydrogen carbonate and boric acid, with boric acid being especially preferred.

Preferred buffer formulations include formulations including citric acid and/or a monohydrogen phosphate and/or a dihydrogen phosphate and/or boric acid in combination with, for example a strong acid and/or an alkali. Especially preferred buffer formulations include a phosphate.

Preferred colloidal suspensions include insoluble oxides and/or hydroxides, preferably of Group III or IV elements, with silica and aluminum hydroxide being especially preferred.

Cations of salts may be selected from group I, II and III, metals and transition metals, especially, first row transition metals. Preferred salts have cations selected from sodium, potassium, magnesium, calcium, aluminum, titanium, manganese, iron, copper and zinc.

Anions of salts may be selected from sulphate, monohydrogenphosphate, dihydrogen phosphate, orthophosphate, polyvinylphosphonate, acetate, citrate, aluminate, chloride, propionate and nitrate.

Preferred salts include aluminum sulphate, sodium dihydrogen phosphate, sodium sulphate, sodium citrate, calcium monohydrogenphosphate, aluminum nitrate, aluminum chloride, titanium III sulphate, iron III nitrate, iron III sulphate, iron II sulphate, iron III phosphate, copper II sulphate, copper nitrate, zinc II sulphate, zinc phosphate and manganese phosphate.

Especially preferred salts include aluminum sulphate, aluminum nitrate, iron III nitrate, iron III sulphate, iron II sulphate, copper II sulphate, copper nitrate and zinc II sulphate.

The most preferred salt is aluminum sulphate.

Where said modifying means comprises a solution or dispersion, the concentration of the solute or dispersant may be at least 2 wt %, suitably at least 3 wt %, preferably at least 4 wt % and more preferably, at least 5 wt %. The concentration of the solute or dispersant may be less than 50 wt %, preferably less than 40 wt % and, more preferably, less than 30 wt %.

Preferred modifying means are those which both modify interaction between said hydrophilic layer and an image layer and which are arranged such that a selected deletion means can be used to make areas of said printing member to which it is applied less ink receptive compared to when said restrictor means consists essentially of 0.1M sulphuric acid.

Preferred modifying means are believed to form a deposit or precipitate over said hydrophilic layer which may act as a barrier to the passage of alkaline material from the hydrophilic layer to the image layer. Such a precipitate is preferably essentially insoluble in water. In some cases, the modifying means applied may be capable of chemically reacting with said hydrophilic layer to produce an insoluble precipitate. For example, when aluminum sulphate is used as said restriction means, insoluble aluminum hydroxide may be formed. In other cases, however, the modifying means may act by washing off material from the hydrophilic layer.

Said restrictor means may be applied by any suitable means, for example by dipping, spraying or roller coating.

Preferably, in the method, the first fluid to be contacted with said hydrophilic layer formed in step (a) has a pH which is less than the pH (before application) of the fluid used to form the hydrophilic layer. Preferably, the first fluid contacted with said hydrophilic layer is said modifying means. Said modifying means may be applied either before, or more preferably after, the hydrophilic layer is touch dry. Thus, preferably, there is no intermediate chemical treatment step between steps (a) and (b) described above.

Preferably, said modifying means is applied in a single step.

The surface to which said image layer is applied may have a pH of less than 8, preferably less than 7. The pH of said surface may be at least 2, preferably at least 3. The pH of said surface may suitably be measured using an aqueous indicator dye.

Said particulate material may be an organic or an inorganic material. organic particulate materials may be provided by latexes. Inorganic particulate materials may be selected from alumina, silica, silicon carbide, zinc sulphide, zirconia, barium sulphate, talcs, clays (e.g. kaolin), lithopone and titanium oxide.

Said particulate material may comprise a first material which has a hardness of greater than 8 Modified Mohs (on a scale of 0 to 15), preferably greater than 9 and, more preferably, greater than 10 Modified Mohs.

Said first material may comprise generally spherical particles. Alternatively, said material may comprise flattened particles or platelets.

Said first material may have a mean particle size of at least 0.1 $\mu$m and preferably at least 0.5 $\mu$m.

Said first material may have a mean particle size of less than 45 $\mu$m, preferably less than 20 $\mu$m, more preferably less than 10 $\mu$m.

The particle size distribution for 95% of particles of the first material may be in the range 0.01 to 150 $\mu$m, preferably in the range 0.05 to 75 $\mu$m, more preferably in the range 0.05 to 30 $\mu$m.

Said first material preferably comprises an inorganic material. Said first material preferably comprises alumina which term includes $Al_2O_3$ and hydrates thereof, for example $Al_2O_3.3H_2O$. Preferably, said material is $Al_2O_3$.

Said particulate material in said fluid may include at least 20 wt %, preferably at least 30 wt % and, more preferably, at least 40 wt % of said first material. Said fluid may include 5 to 40 wt %, preferably 5 to 30 wt %, more preferably 7 to 25 wt %, especially 10 to 20 wt % of said first material.

Said particulate material may comprise a second material. Said second material may have a mean particle size of at least 0.001 $\mu$m, preferably at least 0.01 $\mu$m. Said second material may have a mean particle size of less than 10 $\mu$m, preferably less than 5 $\mu$m and, more preferably, less than 1 $\mu$m.

Mean particle sizes of said first and second materials suitably refer to the primary particle sizes of said materials.

Said particulate material in said fluid may include at least 20 wt %, preferably at least 30 wt % and, more preferably, at least 40 wt % of said second material. Said liquid may include 5 to 40 wt %, preferably 5 to 30 wt %, more preferably 7 to 25 wt %, especially 10 to 20 wt % of said second material.

Said second material is preferably a pigment. Said second material is preferably inorganic. Said second material is preferably titanium dioxide.

Said first and second materials preferably define a multimodal, for example a bimodal particle size distribution.

Said particulate material may include a third material which is preferably adapted to lower the pH of the silicate solution. Said third material may be a colloid, suitably colloidal silica or an inorganic salt, suitably a phosphate, with aluminum phosphate being preferred. Where a third material is provided, preferably less than 30 wt % more preferably less than 20 wt %, especially less than 10 wt % of said particulate material is comprised by said third material.

Said fluid applied in step (a) may comprise a silicate solution in which said particulate material is dispersed.

Said silicate solution may comprise a solution of any soluble silicate including compounds often referred to as water glasses, metasilicates, orthosilicates and sesquisilicates. Said silicate solution may comprise a solution of a modified silicate for example a borosilicate or phosphosilicate.

Said silicate solution may comprise one or more, preferably only one, metal or non-metal silicate. A metal silicate may be an alkali metal silicate. A non-metal silicate may be quaternary ammonium silicate.

Said silicate solution may be formed from silicate wherein the ratio of the number of moles of Si species, for example $SiO_2$, to the number of moles of cationic, for example metal species is in the range 0.25 to 10, preferably in the range 0.25 to about 6, more preferably in the range 0.5 to 4.

Said silicate is preferably alkali metal silicate. In this case, the ratio of the number of moles of $SiO_2$ to the number of moles of $M_2O$ in said silicate, where M represents an alkali metal may be at least 0.25, suitably at least 0.5, preferably at least 1, more preferably at least 1.5. Especially preferred is the case wherein said ratio is at least 2.5. Said ratio may be less than 10, suitably less than 6, preferably less than 5 and more preferably less than 4.

Preferred alkali metal silicates include lithium, sodium and potassium silicates, with lithium and/or sodium silicate being especially preferred. A silicate solution comprising only sodium silicate is most preferred.

Said fluid is suitably non-gaseous.

Said fluid may comprise 2 to 30 wt % of silicate (e.g. dissolved sodium silicate solid), preferably 5 to 20 wt %, more preferably 8 to 16 wt %. The fluid may be prepared using 10 to 60 wt %, preferably 30 to 50 wt %, more preferably 35 to 45 wt % of a silicate solution which comprises 30 to 40 wt % silicate.

Said fluid may include 5 to 60 wt % of particulate material. Preferably, the fluid includes 10 to 50 wt %, more preferably 15 to 45 wt %, especially 20 to 40 wt % of particulate material.

The ratio of the weight of silicate to the weight of particulate material in the fluid is preferably in the range 0.1 to 2 and, more preferably, in the range 0.1 to 1. Especially preferred is the case wherein the ratio is in the range 0.2 to 0.6.

Said liquid may include more than 20 wt %, preferably more than 30 wt %, more preferably more than 40 wt %, especially more than 45 wt % water (including water included in said silicate solution). Said liquid may include less than 80 wt %, preferably less than 70 wt %, more preferably less than 65 wt %, especially less than about 60 wt % water.

Where the fluid comprises a silicate and said particulate material comprises a first material and a second material as described, the ratio of the wt % of silicate (e.g. dissolved sodium silicate solid) to the wt % of said first material may be in the range 0.25 to 4, preferably in the range 0.5 to 1.5 and more preferably about 1. similarly, the ratio of the wt % of silicate to the wt % of said second material may be in the range 0.25 to 4, preferably in the range 0.5 to 1.5 and more preferably about 1. The ratio of the wt % of first material to the wt % of second material may be in the range 0.5 to 2, preferably in the range 0.75 to 1.5, more preferably about 1 to 1.

The pH of said fluid may be greater than 9.0, is preferably greater than 9.5 and, more preferably, greater than 10.0. Especially preferred is the case wherein the pH is greater than 10.5. The pH is suitably controlled so that the silicate remains in solution and does not form a gel. A gel is generally formed when the pH of a silicate solution falls below pH9. The pH of said fluid is preferably less than 14, more preferably less than 13. It is understood that the pH of the fluid affects the adhesion of the hydrophilic layer on the support. It is found that the use of a fluid having a pH as described can lead to a good adhesion.

The fluid may include other compounds for adjusting its properties. For example, the fluid may include one or more surfactants. Said fluid may include 0 to 1 wt % of surfactant(s). A suitable class of surfactants comprises anionic sulphates or sulphonates. The fluid may include viscosity builders for adjusting the viscosity of the fluid. Said fluid may include 0 to 10 to wt %, preferably 0 to 5 wt % of viscosity builder(s). Also, the fluid may include dispersants for dispersing the inorganic particulate material throughout the fluid. Said fluid may include 0 to 2 wt % of dispersant(s). A suitable dispersant may be sodium hexametaphosphate.

Hydrophilic layers of planographic printing plates have been proposed which include organic polymers, for example thermoplastic polymers, for increasing the strength and/or hardness of the hydrophilic layers. Said liquid used in the method of the present invention preferably does not include a thermoplastic organic polymeric material, for example polyvinylidene fluoride or the like.

Said fluid may have a viscosity of less than 100 centipoise when measured at 20° C. and a shear rate of $200s^{-1}$ using a Mettler Rheomat 180 Viscometer incorporating a double gap measuring geometry. Preferably, said viscosity is less than 50 centipoise, more preferably less than 30 centipoise when measured as aforesaid. Especially preferred is the case wherein the viscosity is less than 20 centipoise.

Said fluid may be applied to said support by any suitable means which is preferably non-electrochemical.

Said fluid may be applied to both sides of said support in order to form a hydrophilic layer on both sides. A support with such a layer on both sides may be used to prepare a double-sided lithographic plate. Alternatively, if such a support is used for a single-sided plate, the side of the plate which does not carry an image layer may be protected by the hydrophilic layer. Said fluid is preferably applied to only one surface of said support.

Said fluid may be applied to said support to form a hydrophilic layer having an average thickness after drying, of less than 20 $\mu$m, preferably less than 10 $\mu$m and, more preferably, less than 5 $\mu$m. Especially preferred is the case wherein the average thickness is less than 3 $\mu$m.

The thickness of the hydrophilic layer may be greater than 0.1 $\mu$m, preferably greater than 0.3 $\mu$m and, more preferably, greater than 0.5 $\mu$m.

Said hydrophilic layer may include 1 to 20 g of material/$m^2$ of substrate. Preferably said layer includes 5 to 15 g, more preferably 8 to 12 g, of material/$m^2$ of substrate. Most preferably, said layer includes about 10 g of material $m^2$.

Said particulate material preferably defines formations in said hydrophilic layer which render said layer non-planar and which are arranged such that, when an image layer is applied over said hydrophilic layer, corresponding formations are defined on the surface of the image layer in a manner similar to that described in U.K. Patent Application No. GB 2 277 282, the contents of which are incorporated herein by reference.

The method preferably includes the steps of providing suitable conditions for the removal of water from the fluid after it has been applied to the support in step (a). Suitable conditions -may involve passive or active removal of water and may comprise causing an air flow over the support and/or adjusting the humidity of air surrounding the support. Preferably, the method includes the step of arranging the support in a heated environment. The support may be placed in an environment so that its temperature does not exceed 230° C., preferably does not exceed 200° C. and, more preferably, does not exceed 175° C. Especially preferred is the case wherein the support temperature does not exceed 150° C.

The support may be arranged in the heated environment for less than 180 seconds, preferably less than 120 seconds and, more preferably, less than 100 seconds.

The support may comprise aluminum or an alloy. In this event, it is found to be advantageous to arrange the support in an environment wherein the temperature is less than 230° C. as described above since, at this temperature, annealing of the support is not significant and, therefore, the tensile strength of the support is maintained at an acceptable level. More particularly, the tensile strength of the aluminum, suitably measured using a Hounsfield tensile testing machine, may be at least 100 MPa, preferably at least 110 MPa and, more preferably, at least 120 MPa. Especially preferred is the case wherein the tensile strength is at least 140 MPa.

The fluid described above may also be advantageously applied to a plastic support, for example a polyester, in order to provide a hydrophilic layer thereon, in view of the fact that the fluid needs only to be cured at a relatively low temperature for a short time. As will be appreciated, curing at a relatively high temperature for long periods might otherwise detrimentally affect the properties of the plastics material.

The removal of water from the fluid applied to the support is believed to cause the silicate to polymerize and bind the inorganic particulate material in position.

Thus, it should be appreciated that one advantage of the method of the present invention may be that a relatively wide range of support materials may be used. For example, where the support material is aluminum or an alloy, a relatively low grade metal could be used compared to the grade of metal usually used for lithographic plates. Additionally and/or alternatively, a metal which is more resistant to, for example developer chemicals, could be used. Furthermore, the method may be used to apply a hydrophilic layer to other types of support materials, for example other metals, foil coated paper and plastics.

A support material may be pretreated prior to the application of said hydrophilic layer. Where the support material is aluminum or an aluminum alloy, it may be pretreated by one or more conventional methods used in the surface treatment of aluminum, for example caustic etch cleaning, acid cleaning, brush graining, mechanical graining, slurry graining, sand blasting, abrasive cleaning, electrocleaning, solvent degreasing, ultrasonic cleaning, alkali non-etch cleaning, primer coating, grit/shot blasting and electrograining. Details of such methods are provided in: "The surface treatment and finishing of aluminum and its alloys" S. Wernick, R. Pinner and P. G. Sheasby published by Finishing Publication Ltd., ASM International, 5th edition 1987.

Where the support material is pretreated, preferred pretreatments are those which involve adjusting the character of the surface of the support material, for example those involving cleaning, graining or the like. If a surface coating is, however, applied on the surface of the support material, the coating is preferably applied as a liquid.

Preferably, said liquid comprising a silicate solution as described above is applied to a substantially dry surface on said support.

Preferably, said fluid is applied directly onto said support material of said support.

Preferably, the support material is cleaned and/or etched prior to being contacted with said fluid. Cleaning and/or etching may be achieved using an alkaline liquid, for example sodium hydroxide, optionally with additives such as sodium gluconate and/or sorbitol.

The support material may also be subjected to a desmutting treatment, suitably using nitric acid. After this treatment, the support material should be rinsed and/or dried prior to being contacted with said liquid.

The term "image layer" includes a layer that can subsequently be partially removed in order to define areas to be printed and includes a layer which already defines areas to be printed.

The image layer may be provided over substantially the entire surface of said hydrophilic layer. It may comprise any known photosensitive material whether arranged to form a positive or negative plate. Examples of photosensitive materials include diazonium/diazide materials, polymers which undergo depolymerization or addition photopolymerization and silver halide gelatin assemblies. Examples of suitable materials are disclosed in GB 1 592 281, GB 2 031 442, GB 2 069 164, GB 2 080 964, GB 2 109 573, EP 0 377 589, U.S. Pat. No. 4,268,609 and U.S. Pat. No. 4,567,131. Preferably, the light sensitive material is a quinone diazide material.

Alternatively, said image layer in the form of a desired image for use in planographic printing may be deposited over said hydrophilic layer by a deposition process such as ink jet or laser ablation transfer. An example of the latter is described in U.S. Pat. No. 5,171,650.

Said image layer is preferably arranged over said hydrophilic layer so that formations are defined on the surface of the layer due to formations formed in said hydrophilic layer by particulate material therein. The formations may suitably be arranged to define channels between the light-sensitive layer and a mask so that air can escape from between the layer and the mask in order to decrease the draw-down time of the mask on the layer prior to exposure of the printing plate.

The invention extends to a method of preparing a planographic printing member comprising:
  a) forming a hydrophilic layer on a support by contacting the support with a fluid containing a particulate material;
  b) applying a modifying means over said hydrophilic layer;
  c) providing an image layer over said hydrophilic layer;
  wherein said modifying means is arranged such that a selected deletion means can be used to make areas of said printing member to which it is applied less ink receptive compared to when said restrictor means consists essentially of 0.1 M sulphuric acid.

The invention extends to a printing member when prepared using a method described herein.

The invention extends to a printing member precursor prepared following steps (a) and (b) of any method described herein.

Any feature of any aspect of any invention or embodiment described herein may be combined with any feature of any other aspect of any invention or embodiment described herein.

EXAMPLES

Example 1

General Procedure for the Preparation of a Lithographic Printing Plate

Step 1

Preparation of Aluminium

A 0.3 mm gauge aluminum alloy sheet of designation AA1050 was cut to a size of 230 mm by 350 mm, with the grain running lengthways. The sheet was then immersed face up in a solution of sodium hydroxide dissolved in distilled water (100 g/L) at ambient temperature for 60 seconds and thoroughly rinsed with water.

Step 2

Preparation of Coating Formulation

The following reagents are used in the preparation:

Sodium silicate solution having a ratio $SiO_2:Na_2O$ in the range 3.17 to 3.45 (average about 3.3); a composition of 27.1–28.1 wt % $SiO_2$, 8.4–8.8 wt % $Na_2O$, with the balance being water; and a density of about 75 Twaddel (°Tw), equivalent to 39.5 Baumé (°Bé) and a specific gravity of 1.375.

Deionized water having a resistivity of 5 Mohm.cm $Al_2O_3$ powder comprising alumina (99.6%) in the shape of hexagonal platelets. The mean particle size is 3 µm. The powder has a hardness of 9 Moh (on a 0–10 hardness scale).

Anatase titanium dioxide having a mean primary particle size of 0.2 µm.

Deionized water (150 g; 40 wt %) was added to a 250 ml beaker and sheared using a Silverson high shear mixer. Titanium dioxide powder (53.29 g; 14.21 wt %) was then added in portions over a period of four minutes with the shearing continuing. Then, alumina powder (53.29 g; 14.21 wt %) was added in portions over a period of four minutes with the shearing continuing. On completion of the addition, sodium silicate solution (118.43 g; 31.58 wt %) was added with shearing for a further three minutes. The viscosity of the liquid was found to be about 10 centipoise when measured at 20° C. and a shear rate of $200s^{-1}$ using a Mettler Rheomat 180 Viscometer incorporating a double gap measuring geometry.

Step 3

Application of Coating Formulation

The coating formulation prepared in Step 2 was apllied onto the aluminum sheet prepared in Step 1 using a rotating Meyer bar coater (designation K303) to give a 12 µm wet film thickness.

Step 4

Post Application Treatments

The coated sheets prepared in Step 3 were subjected to various treatments as described in the following Examples.

Step 5

Application of Light Sensitive Coating

A printing plate was produced from a sheet prepared in Step 4 by coating, using a Meyer bar, a quinone diazide/ novalac resin light sensitive material which included a photo-acid generator and Victoria blue which is adapted to change color as a result of the release of acid during exposure. The light sensitive material was dried at 130° C. for 80 seconds.

In the Examples, the following are used:

LUDOX® CL colloidal silica—refers to silica obtained from DuPont.

Bacosol 3C—refers to aluminum hydroxide obtained from Alcan.

Examples 2 to 5

The general procedure of Example 1 was followed. However, after application of the coating formulation in Example 1, Step 3, the plate was fan dried and then the treatments described in Table 1 below were carried out.

TABLE 1

| EXAMPLE NO. | TREATMENT |
|---|---|
| 2 | Plate immersed in 0.1M phosphoric acid for 30 seconds at 22° C. |
| 3 | Plate immersed in 0.1M aluminum sulphate for 30 seconds at 22° C. |
| 4 | Plate immersed in 0.1M sodium dihydrogen phosphate for 30 seconds at 22° C. |
| 5 | Plate immersed in 0.1M aluminum sulphate for 30 seconds at 22° C. |

After the treatments, the plates were rinsed with water and oven dried at 130°°C. for 80 seconds.

Examples 6 to 25

The general procedure of Example 1 was followed. Coated sheets prepared in Example 1, Step 3 were placed in an oven at 130° C. for 80 seconds. The sheets were removed and allowed to cool to ambient temperature. Subsequently the treatments described in Table 2 below were carried out (at ambient temperature, unless otherwise stated). After the treatments described the sheets were fan dried.

TABLE 2

| EXAMPLE NO. | TREATMENT |
|---|---|
| 6 | Plate immersed in a 0.1M aqueous solution of aluminum sulphate of pH 3.4 for 30 seconds. |
| 7 | Plate immersed in a 0.1M aqueous solution of aluminum nitrate at pH 2.8 for 30 seconds. |
| 8 | Plate immersed in a 0.05M aqueous solution of aluminum nitrate at pH 2.8 for 30 seconds. |
| 9 | Plate immersed for 30 seconds in a 1M aqueous solution of aluminum nitrate basified with NaOH to pH 2.8. |
| 10 | Plate immersed for 30 seconds in a 0.01M aqueous solution of aluminum nitrate acidified with $HNO_3$ to pH 2.8. |
| 11 | Plate immersed for 30 seconds in a 0.025M aqueous solution of iron III nitrate acidified to pH 1.6. |
| 12 | Plate immersed for 30 seconds in a 0.1M aqueous solution of iron III nitrate adjusted to pH 1.7. |
| 13 | Plate immersed for 30 seconds in a 0.1M of iron sulphate adjusted to pH 2.5. |
| 14 | Plate immersed for 30 seconds in a 0.1M aqueous solution of copper II sulphate adjusted to pH 4.5. |
| 15 | Plate immersed for 30 seconds in a 0.1M aqueous solution of zinc II sulphate adjusted to pH 5.4 and at a temperature of 70° C. |

TABLE 2-continued

| EXAMPLE NO. | TREATMENT |
|---|---|
| 16 | Plate immersed for 30 seconds in a 50 g/l aqueous solution of zinc phosphate basified with NaOH to pH 3.4. |
| 17 | Plate immersed for 30 seconds in a 25% aqueous solution of Bacosol 3C at 70° C. |
| 18 | Plate immersed for 30 seconds in a 50 wt % aqueous solution of Ludox ® CL colloidal silica acidified to pH 3.4 using $H_2SO_4$. |
| 19 | Plate immersed in a 25 wt % solution of LUDOX ® CL colloidal silicia at pH 3.4 for 30 seconds at 70° C. |
| 20 | 0.05M aqueous solution (pH 1.3) of phosphoric acid roller coated onto plate using a Meyer bar and subsequently fan dried until touch dry. |
| 21 | As Example 20, except 0.025M phosphoric acid solution (pH 1.3) used. |
| 22 | As Example 20, except 0.12M aluminum sulphate aqueous solution (pH 3.6) used. |
| 23 | As Example 20, except 0.1M calcium dihydrogen phosphate aqueous solution (pH 3.6) used. |
| 24 | As Example 20, except 0.1M solution of copper II sulphate (pH 4.5) used. |
| 25 | As Example 20, except 0.1M zinc sulphate solution (pH 4.5) used. |

Example 26

A statistical experimental design was conducted using a substrate prepared generally as described in Example 1, followed by immersion in aluminum sulphate solutions at various concentrations (1.0 wt %, 5.5 wt %, 10 wt %) temperatures (200° C., 40° C. and 60° C.), immersion times (15, 37.5 and 60 seconds) and hydrophilic coating weight (4, 8 and 15 $g/m^2$) in order to determine how these parameters affect the properties of the substrate and/or the final plate prepared.

Example 27

Application of Light Sensitive Coating

The products of Examples 2 to 26 were used to produce printing plates by coating, using a Meyer bar, a light sensitive material comprising a napthoquinone diazide/novalac resin, a photoacid generator and Victoria blue which is adapted to change color as a result of the release of acid during exposure. The light sensitive material was dried at 130° C. for 80 seconds.

Example 28

Exposure

The printing plates produced as described in Example 27 were exposed in the normal manner using a Montakop 65 light frame.

Example 29

Develooment

The exposed plates of Example 28 were developed using a standard positive developer at 20° C. by hand flooding for 10 seconds followed by a further 50 seconds treatment using a hand pad.

Example 30

Post Development

Finisher was applied to the plates of Example 29 using a sponge.

Example 31

Deletion

A positive deletion gel containing cyclohexanone, n-methylpyrrolidone, phosphoric acid, silica and surfactants was applied to an image area of each plate of Example 30 until the image area appeared to have been removed.

Example 32

Inking-in

The plates of Example 31 were inked in using standard inking solution using damp cotton wool.

Example 33

Procedures for Assessment of Performance

Plates prepared as described above were assessed using the following procedures:
i) Color Change The light sensitive material applied as described in Example 27 is arranged to change color when exposed as described in Example 28 in order to indicate that the plate has been exposed. Thus, after exposure, the plates were assessed visually to determine whether the color change had taken place.
ii) Image Deletion After inking-in, as described in Example 32, the plates were assessed visually to determine whether the image areas of the plates, to which deletion gel had been applied in Example 31, accepted ink or not. It will be appreciated that the areas should not accept ink.
iii) Dyestain After deletion as described in Example 31, the plates were assessed visually to determine whether any of the Victoria blue dye included in the light sensitive coating had stained the plate in areas where the coating had been removed.

Results

Each of the plates prepared as described in Examples 2 to 25 was found to give a color change upon exposure (when assessed as described in Example 33(i)); to give image deletion on application of a deletion gel (when assessed as described in Example 33(ii)); and had low/negligible dyestain (when assessed as described in Example 33(iii)).

From the plates prepared in Example 26, it was observed that as the weight of the coating formulations is increased the temperature of the aluminum sulphate dip and/or residence time of plates in the dipping tank needs to be increased to obtain a satisfactory color change as described in Example 34(i).

Each feature disclosed in this specification (including any accompanying claims, abstract and drawings), may be replaced by alternative features serving the same, equivalent or similar purpose, unless expressly stated otherwise. Thus, unless expressly stated otherwise, each feature disclosed is one example only of a generic series of equivalent or similar features.

What is claimed is:

1. A method of preparing a planographic printing member, said method comprising the steps of:
 a) forming a hydrophilic layer on a support by contacting the support with a silicate solution comprising:
  water;
  a soluble alkali metal silicate; and
  a particulate material;
 in which:

the soluble alkali metal silicate is in solution and the particulate material is dispersed in the silicate solution;

the molar ratio of $SiO_2$ to $M_2O$, in which M is an alkali metal, in the soluble alkali metal silicate is at least 2.5 and less than 6; and the silicate solution comprises 5 to 20 wt % of the soluble alkali metal silicate;

b) applying a modifying means over said hydrophilic layer; and c) providing an image layer over said hydrophilic layer, wherein an indicator means is associated with said image layer, said indicator means indicating whether said image layer is in a first or a second state.

2. The method of claim 1 wherein said indicator means is adapted for visually indicating whether said image layer is in the first or the second state.

3. The method of claim 1 wherein said image layer is adapted to have a different pH after exposure compared to the pH before exposure.

4. The method of claim 1 wherein said image layer comprises said indicator means.

5. The method of claim 1 wherein applying said modifying means lowers the pH of the outermost surface of the hydrophilic layer.

6. The method of claim 1 wherein the pH of the silicate solution before said solution contacts said support is greater than the pH of the modifying means before said modifying means is applied to said hydrophilic layer.

7. The method of claim 1 wherein the pH of the silicate solution is greater than 9.

8. The method of claim 1 wherein the pH of the modifying means is less than 10.

9. The method of claim 1 wherein said modifying means includes water as a solvent.

10. The method of claim 1 wherein said modifying means comprises an aqueous solution or dispersion.

11. The method of claim 1 wherein said modifying means includes one or more components selected from acids, buffer formulations, colloidal suspensions and salts.

12. The method of claim 11 wherein said modifying means comprises aluminum sulphate.

13. The method of claim 1 wherein following step (a), said hydrophilic layer is contacted with a fluid, wherein the pH of said fluid is less than the pH of the silicate solution before said solution is contacted with said support.

14. The method of claim 13 wherein said fluid is said modifying means.

15. The method of claim 1 wherein said modifying means comprises a salt.

16. The method of claim 15 wherein said salt is selected from the group consisting of aluminum sulphate, aluminum nitrate, iron III nitrate, iron III sulphate, iron II sulphate, copper II sulphate, copper nitrate, and zinc II sulphate.

17. The method of claim 16 wherein said image layer comprises said indicator means.

18. The method of claim 17 wherein applying said modifying means lowers the pH of the outermost surface of the hydrophilic layer.

19. The method of claim 18 wherein the pH of the silicate solution is greater than 9.

20. The method of claim 19 wherein the pH of the modifying means is less than 10.

21. The method of claim 20 wherein the salt is aluminum sulphate.

22. The method of claim 21 wherein the soluble alkali metal silicate is sodium silicate and the ratio of $SiO_2$ to $Na_2O$ is in the range of 3.17 to 3.45.

23. The method of claim 22 in which there is no intermediate chemical treatment between step (a) and step (b).

24. The method of claim 15 in which there is no intermediate chemical treatment between step (a) and step (b).

25. The method of claim 24 wherein said modifying means comprises aluminum sulphate.

26. The method of claim 1 in which there is no intermediate chemical treatment between step (a) and step (b).

27. A planographic printing member, said planographic printing member prepared by the method comprising the steps of:

a) forming a hydrophilic layer on a support by contacting the support with a silicate solution comprising:
water;
a soluble alkali metal silicate; and
a particulate material;
in which:
the soluble alkali metal silicate is in solution and the particulate material is dispersed in the silicate solution;
the molar ratio of $SiO_2$ to $M_2O$, in which M is an alkali metal, in the soluble alkali metal silicate is at least 2.5 and less than 6; and
the silicate solution comprises 5 to 20 wt % of the soluble alkali metal silicate;

b) applying a modifying means over said hydrophilic layer; and c) providing an image layer over said hydrophilic layer, wherein an indicator means is associated with said image layer, said indicator means indicating whether said image layer is in a first or a second state.

28. The printing member of claim 27 wherein said modifying means comprises aluminum sulphate.

29. A method of preparing a planographic printing member, said method comprising the steps of:

a) forming a hydrophilic layer on a support by contacting the support with a silicate solution comprising:
water;
a soluble alkali metal silicate; and
a particulate material;
in which:
the soluble alkali metal silicate is in solution and the particulate material is dispersed in the silicate solution;
the molar ratio of $SiO_2$ to $M_2O$, in which M is an alkali metal, in the soluble alkali metal silicate is at least 2.5 and less than 6; and
the silicate solution comprises 5 to 20 wt % of the soluble alkali metal silicate;

b) applying a modifying means over said hydrophilic layer.

30. The printing member of claim 29 wherein said modifying means comprises aluminum sulphate.

* * * * *